United States Patent [19]

Leder

[11] Patent Number: 4,513,031
[45] Date of Patent: Apr. 23, 1985

[54] PROCESS FOR FORMING ALLOY LAYER

[75] Inventor: Lewis B. Leder, Chapel Hill, N.C.

[73] Assignee: Xerox Corporation, Stamford, Conn.

[21] Appl. No.: 530,841

[22] Filed: Sep. 9, 1983

[51] Int. Cl.³ .................. B05D 5/12; C23C 11/00; C23C 13/00
[52] U.S. Cl. .................. 427/250; 427/76; 427/255.2; 430/128
[58] Field of Search .......... 430/128; 427/250, 255.1, 427/255.2, 74–76, 294, 295

[56] References Cited

U.S. PATENT DOCUMENTS

| | | | |
|---|---|---|---|
| 2,803,542 | 8/1951 | Ullrich | 96/1 |
| 2,822,300 | 2/1958 | Mayer | 117/201 |
| 2,938,816 | 5/1960 | Gunthier | 117/212 |
| 3,489,560 | 1/1970 | Joseph | 96/1.5 |
| 3,655,377 | 4/1972 | Sechak | 96/1.5 |
| 3,655,430 | 4/1972 | Greaves | 117/107 |
| 4,015,029 | 3/1977 | Elchisak | 427/76 |
| 4,026,703 | 5/1977 | Hayashi et al. | 96/1.5 |
| 4,277,551 | 7/1981 | Sonnonstine et al. | 430/120 |
| 4,314,014 | 2/1982 | Yamamoto et al. | 430/57 |
| 4,377,607 | 3/1983 | Yoshida et al. | 427/250 |

Primary Examiner—Michael R. Lusignan
Attorney, Agent, or Firm—Peter H. Kondo; John E. Beck; Ronald Zibelli

[57] ABSTRACT

A method of forming an alloy layer on the surface of a substrate comprising forming in a vessel a molten bath comprising at least one vaporizable alloying component having a higher vapor pressure than at least one other vaporizable alloying component in said bath, forming a thin, substantially inert, liquid layer of an evaporation retarding film on the upper surface of said molten bath, said liquid layer of an evaporation retarding film having a lower or comparable vapor pressure than both said vaporizable alloying component having a higher vapor pressure and said other vaporizable alloying component on said substrate, co-vaporizing at least a portion of both said vaporizable alloying component having a higher vapor pressure and said other vaporizable alloying component whereby said evaporation retarding film retards the initial evaporation of said vaporizable alloying component having a higher vapor pressure, and forming an alloy layer comprising both said vaporizable alloying component having a higher vapor pressure and said other vaporizable alloying component on said substrate.

21 Claims, 3 Drawing Figures

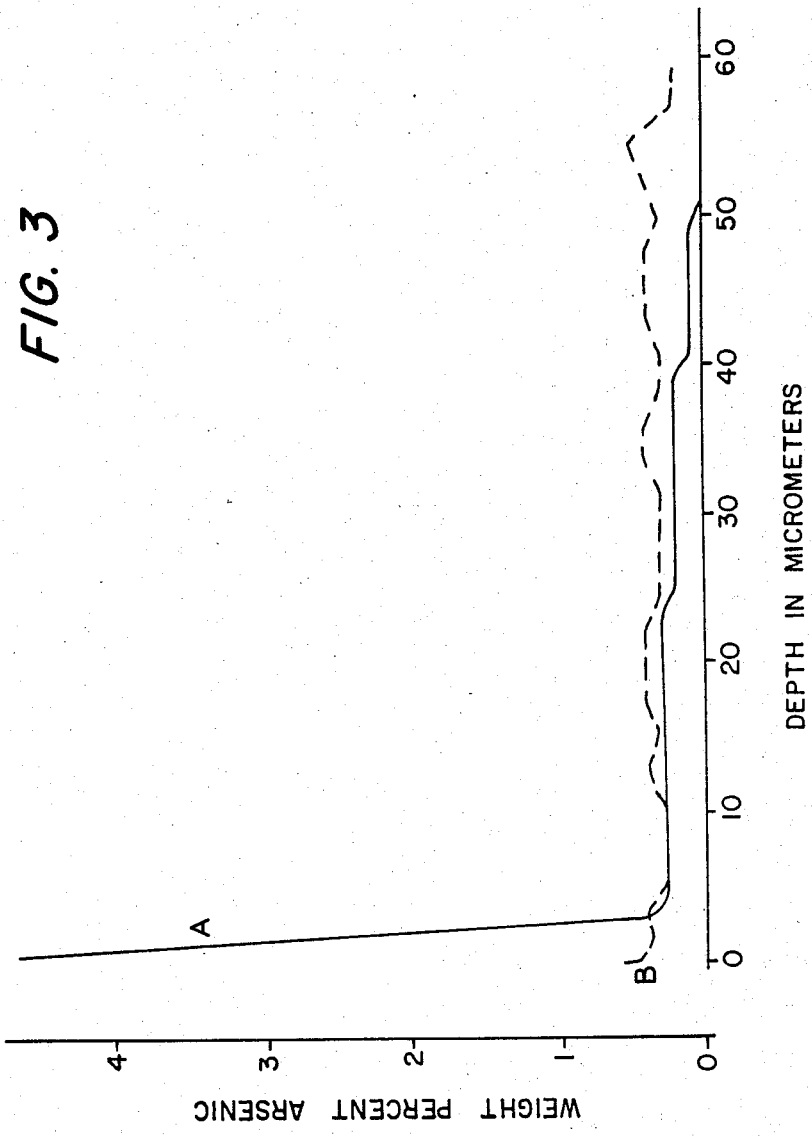

PROCESS FOR FORMING ALLOY LAYER

BACKGROUND OF THE INVENTION

This invention relates generally to a process for forming an alloy layer on the surface of a substrate.

It is customary in the art of electrophotography to form an electrostatic latent image on a photoreceptor drum or plate comprising an electrically conductive backing such as, for example, a metallic or metal-coated base having an inorganic photoconductive insulating layer applied thereto in good charge blocking contact. Typical plates or drums comprise, for example, an aluminum surface having a thin layer of vitreous selenium with an aluminum oxide and/or polymeric interlayer. Such elements are characterized by being capable of accepting and retaining a suitable uniform electrostatic charge in the dark and of quickly and selectively dissipating a substantial part of the charge when exposed to a light pattern.

Electrophotographic elements have been modified in recent years to improve various properties including range of spectral response, heat and charge stability, greater discharge rates, and the like. These improvements may be achieved, for example, by the addition of various alloying components, or other types of additives such as those described in U.S. Pat. Nos. 2,803,542, 2,822,300 and 4,015,029. The addition of various amounts of a vaporizable alloying component, such as tellurium or arsenic, can result in a broad range of changes in the sensitivity, photographic speed, photographic stability and/or other properties of an electrophotographic imaging member.

Suitable alloys or homogeneous mixtures of elemental selenium with other metals suitable for alloying can be admixed and applied by conventional vacuum evaporation techniques. For example, inorganic coating materials may be placed in open or shuttered crucibles during an initial coating step. The xerographic substrate upon which the photoconductive material is to be deposited may, for example, be placed above or in some other suitable location with respect to the coating vapor source. After the chamber has been evacuated to a suitable pressure, e.g. about $5 \times 10^{-5}$ Torr, the vessel containing the photoconductive material and any additives is then generally heated by electrical resistance to effect vaporization of the material. At least some of the vaporized material then condenses on the relatively cool substrate. This type of deposition process normally requires a period of about 15 minutes to about 60 minutes, depending upon the surface area of substrate material to be coated and the desired thickness of the coating material.

It has been found desirable to control the concentration profile through the thickness of one or more photoconductive components in one or more separate layers of different photoconductive materials to obtain desirable photoreceptor characteristics and to avoid certain undesirable properties such as high dark discharge. In one technique, the respective photoconductive alloy components are applied to substrates by coevaporation techniques in which predetermined amounts of the respective photoconductive materials or alloys are placed in separate crucibles or in subdivided crucibles and exposed or heated in a predetermined sequence under vacuum. One possible modification for this purpose involves coating substrates in the presence of one or a plurality of elongated shuttered or unshuttered crucibles heated by electrical heating elements or by other conventional means, the crucibles being subdivided into a plurality of compartments or bins, each capable of carrying different premeasured amounts and kinds of coating materials depending upon the desired final concentration. Another possible modification involves the formation of one or more trains of smaller crucibles temporarily connected to each other and containing various photoconductive materials.

The foregoing modifications are very useful in coating a plurality of substrates simultaneously with a plurality of components. However, there are serious economic and technical limitations inherent in their use. For example, it is very difficult to maintain and efficiently operate mechanical devices such as crucible shutters for batch coating operations due to jamming caused by random condensation of photoconductive material within the vacuum coater. The alternative approach of employing weighed amounts of each desired component in a plurality of open, self-heating crucibles offers a partial solution to the problem except for the substantial expenditures of time and money required to fill a plurality of crucibles with different amounts of different alloying components during each batch coating operation. In addition, it is difficult to avoid contamination, to control spattering, and to control evaporation rate in a timed evaporation sequence due to uneven heat distribution or hot spots of a generally unpredictable nature within individual crucibles and their contents. Run-to-run reproducibility is an inherent problem in the above approaches.

The technical problems noted above can be partially minimized by the use of one or more open crucibles and a timed heating sequence, preferably with irradiation and heating devices such as infrared heat sources. Unfortunately, a number of inorganic photoconductive materials, including selenium and many useful alloys of selenium, are transparent or at least partially transparent to light of the longer wavelengths such as infrared. As a result, the crucible walls and bottom plus various hot spots within each crucible charge will heat up much faster than the upper surface of the crucible charge. This not only results in the inefficient use of energy input due to secondary radiation from the crucible walls and bottom, but may actually result in small explosions due to the build up of gases and cause serious spattering of the coating material with resulting defects on the surfaces being vacuum coated.

One technique for minimizing spattering is by incorporating nonvolatile infrared absorbing heating particles on or within the body of inorganic components prior to effecting evaporation of the components. However, because of the size of the spaces between any particles on the surface of the molten vaporizable alloying components, this technique does not significantly control the rate of deposition of a mixture containing at least one vaporizable alloying component having a higher vapor pressure than at least one other vaporizable alloying component. For example, it has been found that shotted alloys of selenium and tellurium generally fractionate appreciably during evaporation so that a coating having a thickness of about 60 micrometers can have a concentration of tellurium at the top surface of the coating of about 3 to 6 times the tellurium concentration of the starting mixture of selenium and tellurium. This high surface tellurium concentration can significantly reduce or even prevent charge retention on the photoreceptor. It is believed that because of the higher vapor pressure of the selenium it evaporates in greater concentrations early in the vacuum deposition process, thus resulting in progressively increasing concentration of the tellurium component within the container. Similar problems have also been encountered in preparing alloys of selenium and arsenic where the selenium component has a higher vapor pressure than the arsenic component. Various approaches have been taken to control the fractionation problem with limited success, particularly in attempts to reproduce equivalent results with each batch. For example, the alloy shot can be ground and formed into pellets and thereafter utilized in vacuum deposition processes. Although grinding and pelletizing reduces the tendency to form high concentrations of the lower vapor pressure component in the outer region of the deposited alloy layer, the concentration of the lower vapor pressure component at and near the surface of the deposited alloy layer is still undesireably high for many applications. Moreover the grinding and pelletizing steps require additional energy, equipment and time for processing, and may introduce some possible health hazards in the absence of adequate safeguards.

Thus, there is a continuing need for a better system for forming with minimal fractionation an alloy layer on the surface of a substrate where the alloy components comprise at least one vaporizable alloying component having a higher vapor pressure than at least one other vaporizable alloying component.

SUMMARY OF INVENTION

The present invention relates to a method of forming an alloy layer on the surface of a substrate comprising forming in a vessel a molten bath comprising at least one vaporizable alloying component having a higher vapor pressure than at least one other vaporizable alloying component in the bath, forming a thin, substantially inert, liquid layer of an evaporation retarding film on the upper surface of the molten bath, the liquid layer of evaporation retarding film having a lower or comparable vapor pressure than both the vaporizable alloying component having a higher vapor pressure and the other vaporizable alloying component, co-vaporizing at least a portion of both the vaporizable alloying component having a higher vapor pressure and the other vaporizable alloying component whereby the evaporation retarding film retards the initial evaporation of the vaporizable alloying component having a higher vapor pressure, and forming an alloy layer comprising both the vaporizable alloying component having a higher vapor pressure and the other vaporizable alloying component on the substrate.

The advantages of this improved method will become more apparent upon a consideration of the following disclosure of invention, particularly when taken in conjunction with the accompanying Figures.

FIG. 3 is a graph of a control compared to an another embodiment of the invention.

Figure 1:
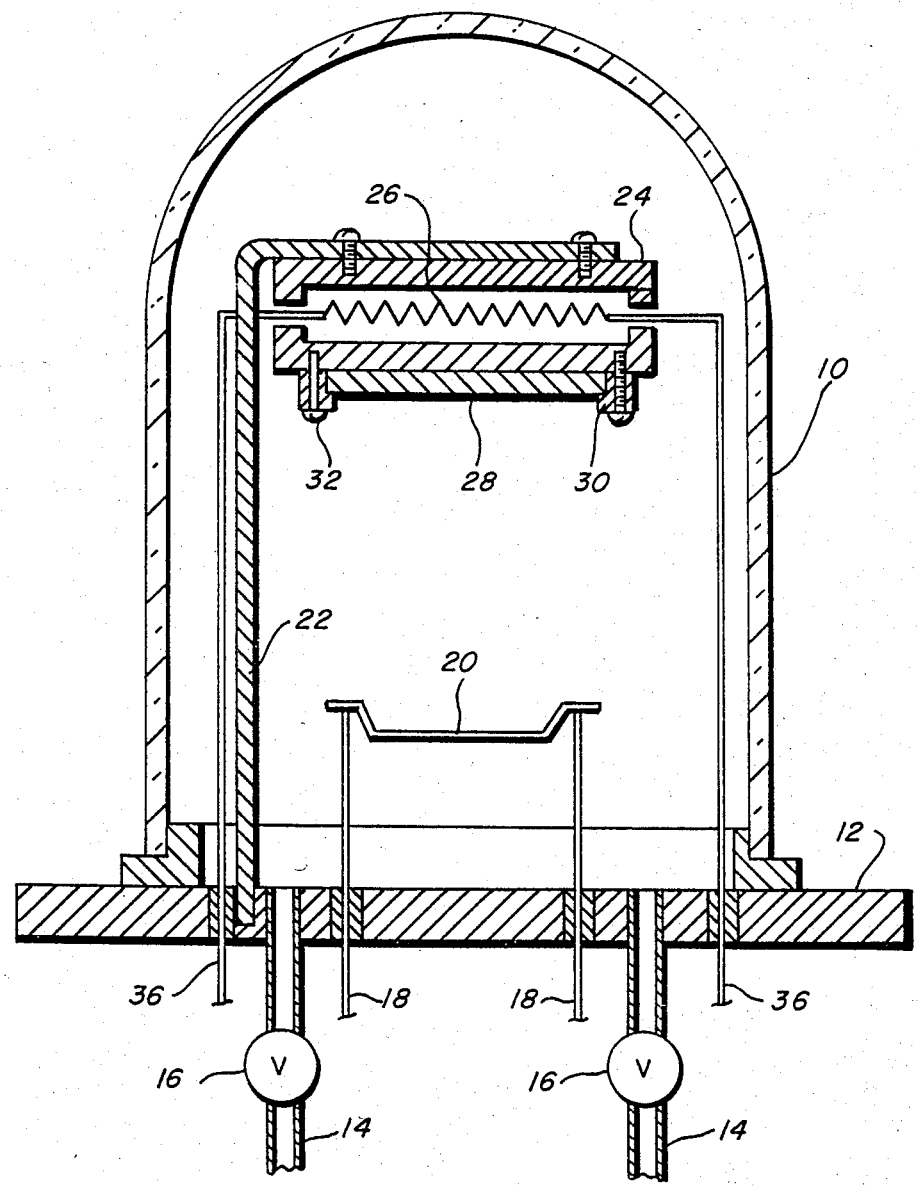
FIG. 1 is a schematic sectional view of an apparatus useful in carrying out the invention.

In the FIG. 1, bell jar 10 is supported by a plate 12 containing a vacuum line 14 and control valves 16. Electrical lead wires 18 carry heating current to crucible 20. A rod 22 is employed to support a heatable platen 24. The heatable platen 24 is provided with resistance heating element 26 and electrical lead wires 36. The substrate 28 to be coated is mounted on the lower face of platen 24 by a masking frame 30 secured to the platen 24 by, for example, screws 32.

An alloy in shot form composed of at least one vaporizable alloying component such as selenium having a higher vapor pressure than at least one other vaporizable alloying component such as tellurium is placed in the crucible 20 composed of an inert material such as quartz or other suitable refractory material.

The pressure within bell jar 10 is maintained at a vacuum of about $2 \times 10^{-5}$ to about $2 \times 10^{-8}$ Torr. A relatively low substrate temperature such as, for example, from about 40° C. to about 90° C. may be employed to condense the vapors onto the substrate 28. The temperature of the components in crucible 20 is maintained at a value between about the melting points and boiling points of the vaporizable alloying components. Thus, for example, in forming a deposit of selenium and tellurium from an alloy in the crucible containing about 90 percent by weight selenium and about 10 percent by weight tellurium, a temperature of about 290° C. is satisfactory.

When alloy layers are formed on the surface of substrate 28 utilizing the aforesaid alloy of tellurium and selenium without an evaporation retarding film on the upper surface of the molten mixture in the crucible 20, the concentration of tellurium on the outer surface of the deposited selenium tellurium alloy layer could contain about 57 percent by weight tellurium. However, when the process is repeated with, for example, about 64 parts per million by weight of a suitable organic material added to the alloy to form an evaporation retarding film on the upper surface of the molten mixture in crucible 20, the concentration of tellurium on the outer surface of the deposited layer is found to be between about 9 to about 12 percent by weight. This is, of course, a dramatic reduction of the concentration of tellurium on the exposed surface of the deposited layer compared to 57 percent tellurium.

Any suitable alloy containing at least one vaporizable alloying component having a higher vapor pressure than at least one other vaporizable alloying component may be utilized in the process of this invention. Typical vaporizable alloying components having relatively high vapor pressures include selenium, sulfur, and the like, and mixtures thereof. Typical vaporizable alloying components having relatively low vapor pressures include tellurium, arsenic, antimony, bismuth, indium, and the like, and mixtures thereof.

If desired, minor amounts of other additives such as iodine, bromine, chlorine, and the like, and mixtures thereof may also be incorporated into the alloy layer.

Any suitable evaporation retarding film forming material may be used to form the film on the upper surface of the molten bath of vaporizable alloying components. The evaporation retarding film forming material preferably should be capable of forming a very thin continuous layer on the upper surface of the molten alloy bath. Thus, the evaporation retarding film preferably should wet the molten alloy mixture, although in exceptional cases partial wetting may be desirable. It should readily flow at less than the temperature of detectable deposition of the vaporizable alloying components having higher vapor pressures in the alloying mixture. Detectable deposition for the purposes of this invention is defined as a deposition rate of about 1 Angstrom per second as determined by a quartz crystal deposition monitor. The evaporation retarding film readily flows when it visibly spreads on a wettable surface at a temperature less than the temperature of detectable deposition. The vapor pressure of the evaporation retarding film should also preferably be less than the vapor pressure of any of the vaporizable alloying components at the vaporization temperature of the alloying components. Moreover, the evaporation retarding film should be stable at least up to the vaporization temperature of the alloying components and should not chemically react with the alloying components. In other words, the evaporation retarding film is preferably substantially inert at least up to the vaporization temperature of the alloys. Moreover, the evaporation retarding film, at the vaporizable temperature of the alloying components, should have a specific gravity less than the specific gravity of the molten bath of alloying components. Any suitable evaporation retarding film material having the foregoing characteristics may be employed. Organic evaporation retarding films are preferred because they most often meet the above properties. Typical evaporation retarding film materials are generally inert oils, greases or waxes at room temperature which readily flow at less than the temperature of detectable deposition of the vaporizable alloying components having higher vapor pressures in the alloying mixture, and may include, for example, long-chain hydrocarbon oils, greases and waxes, lanolin, silicone oils such as dimethylpolysiloxane, branched or linear polyolefins such as polypropylene wax and polyalpha olefin oils, low vapor pressure fatty acids, fluoroether oils and the like and miscible mixtures thereof. Optimum results are achieved with high molecular weight, long-chain hydrocarbon oils and greases generally refined by molecular distillation to have low vapor pressure at the alloy deposition temperatures.

The evaporation retarding film forming material may be added to the alloying components in any suitable manner. For example, it may be dissolved in a solvent and the solution so obtained applied to the surfaces of the vaporizable alloy shot or particles prior to heating. Alternatively, measured amounts of the evaporation retarding film forming material may be added to the alloying component mixture prior to or during the alloying process. Other methods for introducing the evaporation retarding film forming material may include suitable techniques such as by precoating the vessel with the above solution prior to charging the vessel with the alloy to evaporated, coating other non-vaporizable materials added to the vessel, and the like.

Experience indicates that the retarding film should remain on the molten alloy surface throughout the evaporation. Since it also will be evaporating, although at a lower rate because of its lower vapor pressure, the optimum thickness will preferably be determined by the evaporation rate of the retarding film relative to that of the alloy components at the given evaporation temperature. Generally, sufficient evaporation retarding material should be employed to at least form a monomolecular continuous layer. Moreover, factors such as the exposed surface area of the molten bath in the vaporization vessel relative to the capacity of the vessel will affect the amount of evaporation retarding material desired. Generally, satisfactory results may be achieved when about 30 parts per million to about 900 parts per million by weight of the evaporation retarding material, based on the total weight of the vaporizable alloy, is employed. Less than about 30 parts per million by weight may be suitable for embodiments where a discontinuous layer of evaporation retarding material desired.

It should also be recognized that the evaporation retarding film should not be too thick because it may act to retard completely the evaporation of the vaporizable alloy or unduly extend the evaporation time. Although less desirable in most cases, a partially discontinuous evaporation retarding film may be used where less suppression of the vaporizable alloying component having a higher vapor pressure desired. Such a discontinuous film may be achieved by utilizing an insufficient quantity of the evaporation retarding film, selecting an evaporation retarding film material of higher vapor pressure, or selecting an evaporation retarding film forming material which inadequately wets the surface of the molten bath of alloying components thereby forming a discontinuous film or layer or beaded layer.

Conventional alloy deposition apparatus employing open (Langmuir) type vessels or slotted tubular (pseudo-Knudsen) types, may be utilized in carrying out the process of this invention. Heat may be applied to the vessel containing the molten bath by any suitable technique. Typical alloy deposition apparatus are disclosed, for example, in U.S. Pat. No. 3,845,739 to Erhart et al, the entire disclosure thereof incorporated herein by reference. Thus, heating may be accomplished by passing current through the receptacle, by resistance wires in contact with the vessel, indirectly by infrared heating, or by other suitable conventional techniques.

Surprisingly, precise control of the relative concentration of deposited alloys can be achieved with alloys comprising at least one vaporizable alloying component having a higher vapor pressure than at least one other vaporizable alloying component by utilizing the evaporation retarding film forming material of this invention. This technique can, for example, provide improved control and facilitate achievement of desirable properties in alloy layers such as reduced surface conductivity, low dark decay, high charge acceptance, low background and other desirable properties of photoconductive materials.

DESCRIPTION OF PREFERRED EMBODIMENTS

The following examples further define, describe and compare exemplary methods of preparing the alloy layers of the present invention. Parts and percentages are by weight unless otherwise indicated. The examples, other than the control examples, are also intended to illustrate the various preferred embodiments of the present invention.

EXAMPLE I

Four "deep dish" stainless steel crucibles shaped as longitudinal sections of a cylinder having a rectangular opening of 5 centimeters by about 12.5 centimeters and a central depth of about 1.8 centimeters were connected end to end, positioned in a vacuum chamber and connected to a low voltage, high current source such that the passage of current caused heating of the crucibles. The temperature achieved was programmed and controlled by suitable external electronic equipment. An aluminum drum having a length of about 38 centimeters and a diameter of about 8 centimeters was secured to a rotatable shaft about 10 centimeters above the crucibles. The crucibles were charged with about 45 grams of alloy shot having an average diameter of about 1.5 millimeters comprising an alloy containing 90 percent by weight of selenium and about 10 percent by weight of tellurium. After the vacuum chamber was evacuated to about $2 \times 10^{-5}$ Torr, the rotating drum was heated to about 65° C. by suitable means and the alloy was then evaporated onto the aluminum drum surface by maintaining the crucible temperature at about 290° C. by means of the heating current. These conditions were maintained for about 20-40 minutes to accomplish complete vaporization of the alloy material in the crucibles. After the coated drum had cooled to below 55° C. the vacuum chamber was back-filled with air and the coated drum removed from the chamber.

Figure 2:
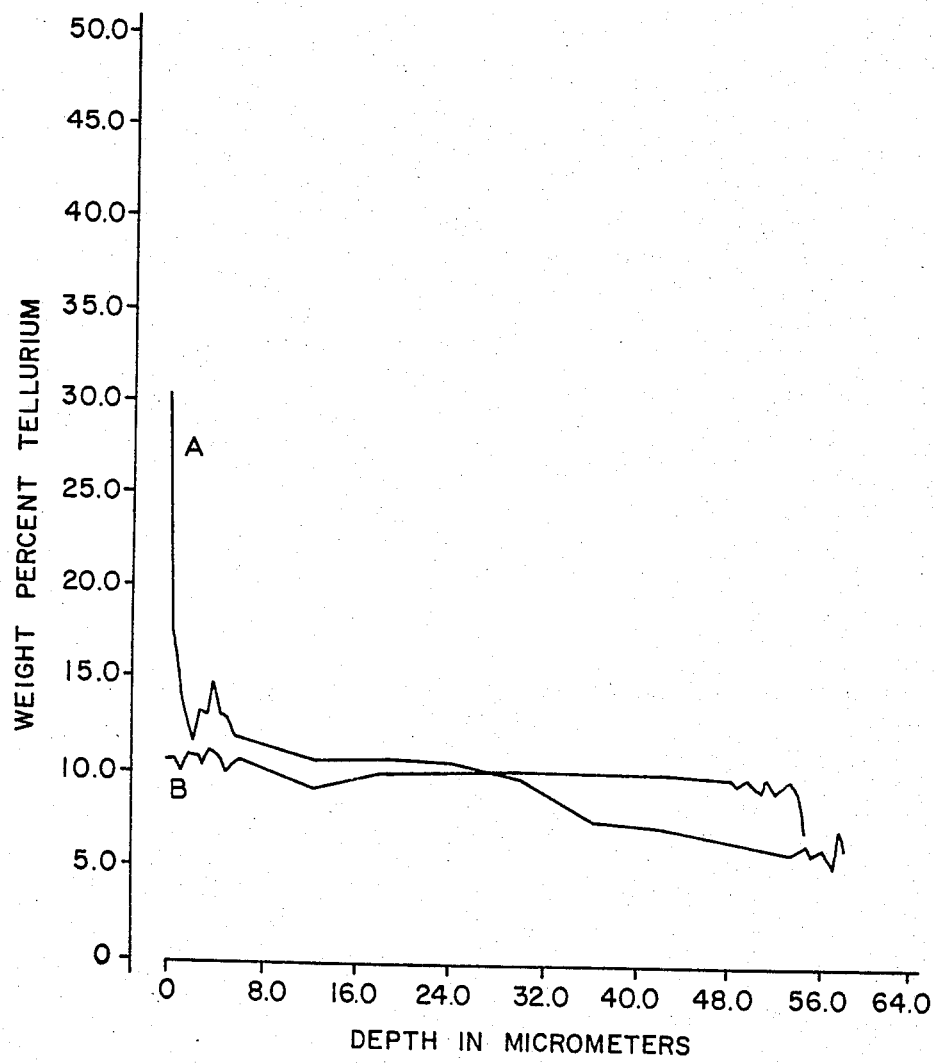
FIG. 2 is a graph of a control compared to an embodiment of the invention.

The tellurium content through the thickness of the coating was measured using well known methods such as electron microprobe analysis, electron diffraction x-ray analysis, ion microprobe mass analysis, etc., on pieces of the coating chipped from the aluminum drum. The exposed top surface of the deposited layer contained about 30.5 percent by weight tellurium. The concentration of the tellurium declined to about 14.5 percent by weight about 1 micrometer beneath the surface of the alloy layer and thereafter gradually declined to about 6 percent by weight of tellurium at the interface with the aluminum substrate about 55 micrometers from the outer surface of the alloy layer. Such a profile of the tellurium within the coated film is illustrated by line A in FIG. 2.

Drums coated with photoreceptor alloys are normally tested for charge acceptance, dark decay, residual voltage after light exposure, and various cyclic voltage characteristics. The first two are particularly affected by the amount of top surface tellurium percentage, and in this example, the material could not hold charge due to the high dark decay resulting from the 30 percent by weight of tellurium at the surface.

EXAMPLE II

The procedure described in Example I was repeated except that prior to charging the crucibles, the selenium-tellurium alloy shot was dipped into a solution of about 0.3 grams of Apiezon L grease (distributed by James G. Biddle Co., Philadelphia, Pa. as a vacuum sealant grease) in about 800 cubic centimeters of hexane solvent. The treated shot was drained of excess solution and then dried with forced air. Apiezon L, the material used in this Example is a highly purified long-chain hydrocarbon with an average molecular weight of about 1,300. It is a grease at room temperature with a vapor pressure of about $10^{-10}$ Torr, becomes liquid at 47° C., and has a vapor pressure of about $10^{-3}$ Torr at 300° C. (compared to a vapor pressure of about $10^{-2}$ Torr at 300° C. for a selenium-tellurium alloy containing 9 percent by weight tellurium). An estimate of the amount of Apiezon L remaining on the shot surface after removal of the hexane solvent was obtained by measuring the volume of liquid removed when 100 grams of shot had been dipped into 200 cubic centimeters of the solution and drained of excess solution. Since the solution concentration was known, calculations could be made which indicated that the shot was coated with approximately 64 parts per million by weight Apiezon L when dipped in the above solution and after the solvent had vaporized. The treated shot was thereafter deposited in the same manner as the the shot described in Example I. The concentration of the tellurium at the exposed surface of the deposited alloy layer was determined to be about 10.8 percent by weight. The concentration profile through the thickness of the coating was essentially flat to a depth of about 52 micrometers from the outer surface of the alloy layer. The tellurium concentration at the interface with the aluminum drum was about 7.5 percent by weight tellurium at a depth of about 53 micrometers. Thus the tellurium concentration at the exposed surface of the deposited alloy later of Example I is about 182 percent greater than the tellurium concentration at the exposed surface of the deposited alloy layer of the instant Example. The tellurium profile so obtained is illustrated by line B FIG. 2.

The alloy layer obtained by this method could be charged to 1,000 volts with dark decay of less than 2.3 percent in 0.1 second and had a residual voltage after blue light exposure of about 5 volts.

EXAMPLE III

The procedure described in Example II was repeated except that two additional runs were made, one with 650 cubic centimeters of solvent and one with 950 cubic centimeters of solvent for 0.3 grams of Apiezon L instead of the 800 cubic centimeters of solvent used in Example II. The results obtained were substantially the same as those obtained in Example II.

EXAMPLE IV

The procedure described in Example I was repeated except that the evaporation retarding material was first physically incorporated into the alloy shot. To accomplish this, 1,000 grams of the alloy of Example I was remelted in a quartz round bottom flask at about 350° C. and about 64 milligrams of Apiezon L grease was introduced into the quartz vessel while packed in the bore of a length of a quartz tubing. Upon being heated to 350° C. the Apiezon L liquified, flowing out of the tubing. The molten alloy plus Apiezon L mixture was sparged with flowing nitrogen gas for about 10 minutes and thereafter reshotted, the shot now containing 64 parts per million by weight of Apiezon L. After deposition of the alloy layer on the drum using the above prepared alloy and under the conditions described in Example I, analysis of the deposited layer revealed that the exposed surface contained about 11 percent by weight of tellurium. The concentration remained relatively flat through the thickness of the layer to a depth of 60 micrometers at which point it dipped to about 6.5 percent by weight tellurium at the interface between the alloy layer and the aluminum drum. Thus, the tellurium concentration at the exposed surface of the deposited alloy layer of the instant example was about one third the tellurium concentration at the exposed surface of the deposited alloy layer of Example I. The charge acceptance, residual voltage and dark decay of the coated drum of the instant example were equivalent to those of Example II with dark decay of 1.6 percent and residual voltage of 5 volts. Thus, incorporation of the retarding film forming material directly into the alloy prior to the shot forming process provides an alternative to the case when one must treat shot already formed such as illustrated in Examples II and III.

EXAMPLE V

The procedure described in Example IV was repeated except that the crucibles were charged with a mixture of the Apiezon L doped alloy shot and some untreated or undoped alloy shot to produce an effective concentration of the Apiezon L in the mixture of about 50 parts per million by weight. The tellurium concentration at the exposed surface of the deposited layer obtained in this instance averaged about 9.9 percent by weight of tellurium and remained substantially flat to a depth of about 58 micrometers. The concentration of tellurium at the interface of the alloy layer with the aluminum drum was about 7 percent by weight at a depth of about 59.5 microns from the outer surface of the alloy layer. Thus the tellurium concentration at the exposed surface of the deposited aloy layer of Example I is about 210 percent greater than the tellurium concentration at the exposed surface of the deposited alloy layer of the instant Example. The dark decay for this alloy layer was 1.3 percent and residual voltage was 1 volt.

EXAMPLE VI

The procedure described in Example V was repeated except that the concentration of the Apeizon L was adjusted with still more untreated alloy shot to provide an Apeizon L concentration of about 40 parts per million. The average concentration of the tellurium at substantially the external surface of the alloy layer was about 12.5 percent by weight tellurium. The concentration of the tellurium from about 5 micrometers beneath the exposed surface of the alloy layer to about 50 micrometers beneath the outer surface of the alloy layer remained essentially flat at about 10 to 11 percent and thereafter declined from about 10 percent at about 56 micrometers to about 7 percent by weight tellurium at a depth of about 58 micrometers which was at the interface of the alloy layer with the aluminum drum. Thus the tellurium concentration at the exposed surface of the deposited alloy layer of Example I is about 144 percent greater than the tellurium concentration at the exposed surface of the deposited alloy layer of the instant Example. The dark decay for this alloy layer was 1.5 percent and there were zero residual volts.

EXAMPLE VII

The Apiezon L doped alloy shot described in Example IV was applied to an aluminum drum by means of two slotted tube crucibles placed side by side, with their axes parallel to the axis of the aluminum drum, instead of the deep dish crucibles. The tube crucibles had diameters of about 2.4 centimeters, slot widths of 0.6 centimeters, and lengths of about 55 centimeters. Heating and temperature control were accomplished in the same manner as described in Example I. The concentration distribution of the tellurium deposited with the tube crucible sources is substantially the same as that obtained with the crucibles of Example IV with the value at the exposed surface being 10.7 percent by weight tellurium. Charge acceptance was excellent and the dark decay was 1.3 percent with residual voltage of 20 volts.

EXAMPLE VIII

The procedure of Example I was repeated except that the four crucibles were flat-bottomed with a depth of about 0.6 centimeters and the alloy shot consisted of about 0.5 percent by weight of arsenic, 99.5 percent of weight of selenium and about 10 parts per million by weight of chlorine instead of tellurium and selenium. After vaporization of the alloy in the manner described in Example I the concentration of the arsenic at the exposed surface of the deposited layer was determined to be about 4.9 percent by weight. Another run resulted in a concentration of arsenic at the exposed suface of the deposited alloy layer of about 4.0 percent by weight. The arsenic concentration profile through the thickness of the coating flattened out at a concentration of about 0.26 percent at a depth of about 7.5 micrometers from the outer surface of the alloy layer and gradually dropped to about 0 percent at about 51 micrometers from the outer surface of the alloy layer. The arsenic concentration at the interface with the aluminum drum was about 0 percent by weight at a depth of about 59 micrometers. Such a profile of arsenic within the deposited layer is illustrated by line A in FIG. 3.

Electrical properties of the deposited layer were measured in the same way as for the previous examples. Dark decay was about 2.3 percent and residual voltage was about 25 volts.

EXAMPLE IX

The procedure described in Example VIII was repeated except that the selenium and arsenic alloy shot is dipped into a solution of about 0.3 gram of Apeizon L in about 1200 cubic centimeters of hexane solvent. The treated shot was then dried with forced air. The amount of Apeizon L remaining on the shot surface is obtained by measuring the volume of liquid removed on 100 grams of shot that has been dipped into 200 cubic centimeters of the solution. Since the concentration is known, calculations indicated that the shot was coated with approximately 43 parts per million by weight Apeizon L when dipped in a solution of 0.3 grams of Apeizon L in about 1200 cubic centimeters of solvent. The treated shot was thereafter deposited in the same manner as the shot described in Example XIII. The concentration of the arsenic at the exposed surface of the deposited alloy layer was determined to be about 0.8 percent by weight. The arsenic concentration profile through the thickness of the coating flattened out at a depth of about 1 micrometer from the outer surface of the alloy layer, and had an average value of about 0.5 percent to the interface with the aluminum drum which was at a depth of about 59 micrometers. The arsenic profile so obtained is illustrated by line B of FIG. 3. Thus the arsenic concentration at the exposed surface of the deposited alloy layer of Example VIII is about 390 percent for one run and about 300 percent for another run greater than the arsenic concentration at the exposed surface of the deposited alloy layer of the instant Example.

The dark decay in this case was about 1.6 percent and residual voltage was about 50 volts.

EXAMPLE X

Alloy shot of about 2.0 percent by weight arsenic and about 98.0 percent by weight selenium were placed in a single flat bottomed crucible having a depth of about 0.6 centimeter and measuring about 2.5 centimeters by about 12.5 centimeters in the rectangular sides. This crucible was placed about 10 centimeters below an aluminum plate 0.15 centimeter thick and 5 centimeters square which was heated to about 70° C. The alloy shot was then evaporated on the aluminum plate with the crucible heated to about 310° C. to form an alloy layer about 4 micrometers thick on the aluminum plate. The concentration of the arsenic at the exposed surface of the deposited alloy layer in one run was determined by electron microprobe analysis to be about 9.2 percent by weight and in another run it was 13.1 percent by weight of arsenic. The arsenic concentration profile through the thickness of the coating decreased rapidly to a concentration of about 1.8 percent at a depth of about 1.0 micrometer from the outer surface of the layer and then dropped more slowly to about 0.1 percent arsenic at the interface with the aluminum plate.

EXAMPLE XI

The procedure described in Example X was repeated except that the selenium and arsenic alloy shot was dipped into a solution of about 0.3 gram of Apeizon L in about 200 cubic centimeters of hexane solvent. The treated shot was then dried with forced air. The amount of Apeizon L remaining on the shot surface was obtained by measuring the volume of liquid removed with 100 grams of shot that has been dipped into 200 cubic centimeters of the solution. Since the solution concentration was known, calculations indicated that the shot was coated with approximately 256 parts per million by weight Apeizon L when dipped in a solution of 0.3 gram of Apeizon L in about 200 cubic centimeters of solvent. The treated shot was thereafter deposited in the same manner as the shot described in Example X. The concentration of the arsenic at the exposed surface of the deposited alloy layer was determined to be about 2.8 percent by weight. The arsenic concentration profile through the thickness of the coating rose somewhat to a depth of about 2 micrometer from the outer surface of the alloy layer, then decreased to about 0.7 percent at the interface with the aluminum plate which was at a depth of about 4 micrometers. Thus the arsenic concentration at the exposed surface of the deposited alloy layer of Example X was about 229 percent for one run and about 368 percent for another run greater the the arsenic concentration at the exposed surface of the deposited layer of the instant Example.

EXAMPLE XII

Four flat-bottomed, shallow stainless steel crucibles having a rectangular cross sectional opening of about 5 centimeters in width by about 12.5 centimeters length and a depth of about 0.6 centimeter were connected end to end, positioned in a vacuum chamber and connected to a low voltage, high current source such that the passage of current caused heating of the crucible. The temperature achieved was programmed and controlled by suitable external electronic equipment. An aluminum drum having a length of about 38 centimeters and a diameter of about 8 centimeters was secured to a rotatable shaft about 10 centimeters above the crucibles with its axis parallel to the axis formed by the string of crucibles. The crucibles were charged with about 45 grams of alloy shot having an average diameter of about 1.5 millimeters comprising an alloy containing 90 percent by weight of selenium and about 10 percent by weight of tellurium. After the vacuum chamber was evacuated to about $2 \times 10^{-5}$ Torr the rotating drum was heated to about 65° C. by suitable means and the alloy was then evaporated onto the aluminum drum suface by maintaining the crucible temperature at about 290° C. by means of the heating current. These conditions were maintained for about 20–40 minutes to accomplish complete vaporization of the alloy material in the crucibles. After the coated drum had cooled to below 55° C. the vacuum chamber was back-filled with air and the coated drum removed from the chamber.

The tellurium content through the thickness of the coating was measured using well-known methods such as electron microprobe analysis, electron diffraction x-ray analysis, ion microprobe mass analysis, etc. on pieces of the coating chipped from the aluminum drum. The exposed top surface of the deposited layer contained about 52 percent by weight tellurium. The concentration of tellurium declined to about 14.8 percent by weight tellurium about 1.5 micrometers beneath the surface of the alloy layer and thereafter gradually decreased to about 2.5 percent by weight tellurium at the interface with the aluminum substrate about 60 micrometers from the outer surface of the alloy layer. The coating on the drum was tested for electrical properties in the same manner as described in Example I and the coating could not hold charge due to the high dark decay resulting from the 52 percent tellurium at the surface.

EXAMPLE XIII

The procedure described in Example XII was repeated except that prior to charging the crucible the selenium-tellurium alloy shot was dipped into a solution consisting of 800 cubic centimeters of toluene containing 0.3 gram of a synthetic poly-alpha-olefin hydrocarbon (an experimental low vapor pressure oil designated F810731 and distributed by William F Nye Inc., New Bedford, Mass.). This material referred to herein as F810 is a viscous oil at room temperature and has a vapor pressure of about $4 \times 10^{-5}$ Torr at 300° C. (compared to a 9 percent tellurium-selenium alloy vapor pressure of about $10^{-2}$ Torr at 300° C.). An estimate of the amount of F810 remaining on the shot surface after removal of the toluene solvent was obtained by measuring the volume of liquid solution removed when 100 grams of shot had been dipped into 200 cubic centimeters of the solution and drained of excess solution. Since the solution concentration was known, calculations could be made which indicated that the shot was coated with approximately 64 parts per million by weight of F810 when dipped in the above solution and after the solvent had vaporized. The treated shot was thereafter deposited in the same manner as the shot described in Example XII. The concentration of the tellurium at the exposed surface of the deposited alloy layer was determined to be about 10.8 percent by weight. The concentration profile showed a brief rise to 12.0 percent by weight tellurium then dropped back to 10.8 percent by weight tellurium after which the tellurium content decreased slowly to 10.0 percent by weight to about 58 micrometers from the outer surface of the alloy layer. The tellurium concentration at the interface with the aluminum drum was about 6.5 percent by weight at a depth of 60 micrometers. Thus the tellurium concentration at the exposed surface of the deposited layer of Example XII is about 289 percent greater than the tellurium concentration at the exposed surface of the deposited alloy layer of the instant Example.

The alloy layer obtained by this method could be charged to 1000 volts with a dark decay of 1.4 percent in 0.1 second and had a residual voltage of about 133 volts.

EXAMPLE XIV

The alloy shot treated as described in Example XIII was applied to an aluminum drum by means of two slotted tube crucibles placed side by side with, their axes parallel to the axis of the aluminum drum, instead of the deep dish crucibles. The tube crucibles had diameters of about 2.4 centimeters, slot widths of 0.6 centimeter, and length of about 55 centimeters. Heating and temperature control were accomplished in the same manner as described in Example I. The concentration distribution of the tellurium deposited with the tube crucible sources is substantially the same as that obtained with the crucibles of Example XIII with the value at the exposed surface being 11.3 percent by weight tellurium. Charge acceptance was excellent, the dark decay was 2.0 percent, and the residual voltage was 1 volt.

EXAMPLE XV

The procedure described in Example XIV was repeated except that two additional runs were made, one with 600 cubic centimeters of solvent and one with 1000 cubic centimeters of solvent for 0.3 grams of Nye F810. The results obtained were substantially the same as those obtained in Example XIV.

EXAMPLE XVI

The evaporation procedure described in Example XIV was repeated except that the same alloy shot were treated by dipping them into a solution of 0.3 gram of Apeizon N in 800 cubic centimeters of hexane solvent. Apeizon N (distributed by James G Biddle Co. of Philadelphia, Pa as a vacuum sealant grease) is a less refined long chain hydrocarbon than Apeizon L the use of which was described in previous examples and having a vapor pressure at 300° C. about an order of magnitude greater than that of Apeizon L. The results after the evaporation of the alloy shot treated with Apeizon N were substantially equivalent to those obtained in Example XIV with the value at the exposed surface being 11.4 percent by weight of tellurium. The dark decay was equal to 1.9 percent and the residual voltage of 16 volts was slightly greater than that of Example XIV indicating the effect of the vapor pressure of the evaporation retarding film material.

EXAMPLE XVII

The evaporation and shot treatment procedures described in Example II were repeated except that the alloy shot contained 10.4 percent by weight tellurium, 89.6 percent by weight selenium and 22 parts per million by weight of chlorine. The alloy shot was treated with a solution of 0.3 gram of an experimental oil designated SRG300 (prepared by Kendall Refining Co., Division of Witco Chemical Corp.) being liquid at room temperature and having a vapor pressure of about $1 \times 10^{-3}$ Torr at 300° C. The exposed surface of the alloy coated on the aluminum drum contained 10.0 percent by weight tellurium, charge acceptance was excellent, dark decay was 1.9 percent and residual voltage after blue light exposure was 21 volts.

Although the invention has been described with reference to specific preferred embodiments, it is not intended to be limited thereto, rather those skilled in the art will recognize that variations and modifications may be made therein which are within the spirit of the invention and within the scope of the claims.

I claim:

1. A method of forming an alloy layer on the surface of a substrate comprising forming in a vessel a molten bath comprising at least one vaporizable alloying component having a higher vapor pressure than at least one other vaporizable alloying component in said bath, forming a thin, substantially inert, liquid layer of an evaporation retarding film forming material on the upper surface of said molten bath, co-vaporizing at least a portion of both said vaporizable alloying component having a higher vapor pressure and said other vaporizable alloying component whereby said evaporation retarding film retards the initial evaporation of said vaporizable alloying component having a higher vapor pressure, and forming an alloy layer comprising both said vaporizable alloying component having a higher vapor pressure and said other vaporizable alloying component on said substrate.

2. A method of forming an alloy layer in accordance with claim 1 comprising forming shot comprising both said vaporizable alloying component having a higher vapor pressure and said other vaporizable alloying material and coating said shot with said evaporation retarding film forming material prior to forming said molten bath.

3. A method of forming an alloy layer in accordance with claim 2 wherein said shot is coated with about 30 parts per million to about 900 parts per million by weight of said evaporation retarding film forming material based on the total weight of the shot.

4. A method of forming an alloy layer in accordance with claim 2 wherein said alloy shot is coated with said evaporation retarding film forming material by dipping said alloy shot in a solution containing said evaporation retarding film forming material.

5. A method of forming an alloy layer in accordance with claim 1 wherein a material inert to said vaporizable alloying component having a higher vapor pressure and said other vaporizable alloying component is first coated with said evaporation retarding prior to forming said molten bath.

6. A method of forming an alloy layer in accordance with claim 5 wherein the said vessel is coated on its inner surface with said evaporation retarding film forming material prior to adding said vaporizable alloying component having a higher vapor pressure and said other vaporizable alloying component to said evaporation vessel.

7. A method of forming an alloy layer in accordance with claim 1 comprising forming shot comprising said vaporizable alloying component having a higher vapor pressure, said other vaporizable alloying material and said evaporation retarding film forming material prior to forming said molten bath.

8. A method of forming an alloy layer in accordance with claim 7 wherein said shot contains about 30 parts per million to about 900 parts per million by weight of said evaporation retarding film forming material based on the total weight of said shot.

9. A method of forming an alloy layer in accordance with claim 7 wherein said shot containing said evaporation retarding film forming material is admixed with said shot free of said evaporation retarding film forming material thereby changing the concentration of said evaporation retarding film forming material relative to the total alloy material present after forming said molten bath.

10. A method of forming an alloy layer in accordance with claim 1 wherein said evaporation retarding film forming material has a melting point lower than both said vaporizable alloying component having a higher vapor pressure and said other vaporizable alloying component.

11. A method of forming an alloy layer in accordance with claim 1 wherein said evaporation retarding film forming material has a lower vapor pressure than both said vaporizable alloying component having a higher vapor pressure and said other vaporizable alloying component.

12. A method of forming an alloy layer in accordance with claim 1 wherein said vaporizable alloying component having a higher vapor pressure is selenium.

13. A method of forming an alloy layer in accordance with claim 12 wherein said other vaporizable alloying component is selected from the group consisting of tellurium and arsenic.

14. A method of forming an alloy layer in accordance with claim 1 wherein said evaporation retarding film forming material is selected from the group consisting of long chain high molecular weight hydrocarbon oils, greases and waxes.

15. A method of forming an alloy layer in accordance with claim 1 wherein said evaporation retarding film forming material is a branched or linear olefinic polymer.

16. A method of forming an alloy layer in accordance with claim 1 wherein said evaporation retarding film forming material comprises a mixture of long chain high molecular weight hydrocarbon compounds.

17. A method of forming an alloy layer in accordance with claim 1 wherein said evaporation retarding film forms a continuous layer on said surface of the said molten bath.

18. A method of forming an alloy layer in accordance with claim 1 wherein the said liquid layer of said evaporation retarding film is at least monomolecular in thickness.

19. A method of forming an alloy layer in accordance with claim 1 wherein said evaporation retarding film forming material forms a discontinuous layer on the surface of the said molten bath.

20. A method of forming an alloy layer in accordance with claim 19 wherein said concentration of said evaporation retarding film forming material is less than about 30 parts per million by weight based on the total weight of said vaporizable alloying component having a higher vapor pressure and said other vaporizable alloying component.

21. A method of forming an alloy layer in accordance with claim 19 wherein the said evaporation retarding film forming material partially wets said surface of the said molten bath.

* * * * *